US010262934B2

(12) United States Patent
Kim et al.

(10) Patent No.: US 10,262,934 B2
(45) Date of Patent: *Apr. 16, 2019

(54) THREE PLATE MIM CAPACITOR VIA INTEGRITY VERIFICATION

(71) Applicant: International Business Machines Corporation, Armonk, NY (US)

(72) Inventors: Andrew T. Kim, Poughkeepsie, NY (US); Baozhen Li, South Burlington, VT (US); Barry P. Linder, Hastings-on-Hudson, NY (US); Ernest Y. Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/800,106

(22) Filed: Nov. 1, 2017

(65) Prior Publication Data
US 2018/0226339 A1    Aug. 9, 2018

Related U.S. Application Data

(63) Continuation of application No. 15/426,612, filed on Feb. 7, 2017.

(51) Int. Cl.
*H01L 23/522*  (2006.01)
*G01R 31/02*  (2006.01)
(Continued)

(52) U.S. Cl.
CPC ........ *H01L 23/5223* (2013.01); *G01R 31/028* (2013.01); *H01L 22/32* (2013.01);
(Continued)

(58) Field of Classification Search
CPC ...... G01R 31/00; G01R 31/02; G01R 31/028; H01L 22/00; H01L 22/30; H01L 22/32;
(Continued)

(56) References Cited

U.S. PATENT DOCUMENTS 3,934,195 A    1/1976  Shires
7,026,235 B1   4/2006  Ben-Tzur et al.
(Continued)

OTHER PUBLICATIONS

T. K. S. Wong, "Time dependent dielectric breakdown in copper low-k interconnects: Mechanisms and reliability models," Materials, vol. 5, No. 9, 2012, pp. 1602-1625.
(Continued)

*Primary Examiner* — Hoai-An D. Nguyen
(74) *Attorney, Agent, or Firm* — ZIP Group PLLC

(57) ABSTRACT

A three plate MIM capacitor structure includes a three plate MIM capacitor, a first wire in a metal layer above/below the three plate MIM, a second wire below/above the three plate MIM, a third wire below/above the three plate MIM, a first via connected to the first test wire, a second via connected to a middle plate of the three plate MIM, and a third via connected to the top and bottom plates of the three plate MIM. The test structure may verify the integrity the MIM capacitor by applying a potential to the first test wire, applying ground potential to both the second test wire and the third test wire, and detecting leakage current across the first wire and the second and third wires or detecting leakage current across the second wire and the third wire.

20 Claims, 8 Drawing Sheets

(51) Int. Cl.
  *H01L 21/66* (2006.01)
  *H01L 49/02* (2006.01)
(52) U.S. Cl.
  CPC .......... *H01L 23/5226* (2013.01); *H01L 28/88* (2013.01); *H01L 28/40* (2013.01)
(58) Field of Classification Search
  CPC ....... H01L 23/00; H01L 23/52; H01L 23/522; H01L 23/5222; H01L 23/5223; H01L 23/5226; H01L 28/00; H01L 28/40; H01L 28/60; H01L 28/82; H01L 28/86; H01L 28/88
  USPC ....... 324/500, 509, 512, 522, 523, 525, 527, 324/528, 537, 548, 555, 762.01; 361/301.1, 306.1, 306.3, 307, 308.1, 361/308.3, 310
  See application file for complete search history.

(56) References Cited

U.S. PATENT DOCUMENTS

| | | | |
|---|---|---|---|
| 7,170,090 B1 | 1/2007 | Chaparala et al. | |
| 7,391,219 B2 * | 6/2008 | Ahiko | G01R 31/028 324/525 |
| 7,468,525 B2 | 12/2008 | Avanzino et al. | |
| 7,678,659 B2 | 3/2010 | Tu et al. | |
| 7,824,935 B2 | 11/2010 | Verma et al. | |
| 8,649,153 B2 | 2/2014 | Dunn et al. | |
| 8,884,288 B1 | 11/2014 | Li et al. | |
| 9,153,504 B2 | 10/2015 | Lai et al. | |
| 9,373,680 B1 | 6/2016 | Lee et al. | |
| 2005/0212082 A1 * | 9/2005 | Takeda | H01L 28/40 257/534 |
| 2014/0264748 A1 * | 9/2014 | Fujiwara | H01L 28/40 257/532 |
| 2016/0003887 A1 * | 1/2016 | Nagase | G01R 31/1263 327/546 |
| 2016/0231382 A1 * | 8/2016 | Hirose | G01R 31/3277 |

OTHER PUBLICATIONS

List of IBM Patents or Patent Applications Treated as Related, dated herewith.

* cited by examiner

US 10,262,934 B2

THREE PLATE MIM CAPACITOR VIA INTEGRITY VERIFICATION

FIELD

Embodiments of invention generally relate to semiconductor devices, design structures for designing a semiconductor device, and semiconductor device verification methods. More particularly, embodiments relate to a three plate metal-insulator-metal (MIM) capacitor integrity verification structure within a semiconductor device that may verify the operational integrity of a via (vertical interconnect access) that extends through one or more of the three plates of the MIM capacitor.

BACKGROUND

To obtain greater capacitance density, three plate MIM capacitors have been utilized as decoupling capacitors located between metal layers of integrated circuit devices. The three plate MIM capacitor includes a top plate, middle plate, and bottom plate, each separated by an insulator. Each plate may be electrically connected to a wire within a metal layer below or above the three plate MIM capacitor by a via.

Typically, the via is fabricated by forming a vertical trench by etching multiple layers of the insulator. Due to different material properties of the multiple layers, the via etch may undesirably traverse horizontally, and thereby form a pocket located outside a predetermined vertical bound of the trench. Prior to forming the via within the trench, a liner may be formed upon the vertical trench sidewall to attempt to create the desired vertical bound of the trench. However, the liner may not effectively fill or cover the pocket and conductive material may be formed within the trench during via formation or may later leak into the pocket during operation of the semiconductor device. The conductive material within the pocket may result in undesired electrical shorting.

SUMMARY

In an embodiment of the present invention, a method of testing a three plate MIM capacitor structure is claimed. The method includes applying a voltage to a first plate of a three plate MIM capacitor, a second plate of the three plate MIM capacitor, and a third plate of the three plate MIM capacitor. The method further includes applying ground potential to a via adjacent to the three plate MIM capacitor. The method further includes detecting leakage current across the middle plate and the via, detecting leakage current across the top plate and the via, or detecting leakage current across the middle plate and the via. The method further includes determining there is a short between one of the bottom plate, middle plate, or top plate and the via caused by a defect of the via, if leakage current is detected across the middle plate and the via, if leakage current is detected across the top plate and the via, or if leakage current is detected across the middle plate and the via.

In another embodiment of the present invention, a three plate MIM capacitor structure is claimed. The structure includes a three plate MIM capacitor comprising a bottom plate, a middle plate, and a top plate. The structure further includes a via matrix normal to the bottom plate, the middle plate, and the top plate. The via matrix includes a first via group that includes vias that are adjacent to the bottom plate, middle plate, and top plate. The via matrix a second via group that includes vias that are configured to contact only the middle plate. The via matrix also includes a third via group that includes vias that are configured to contact only the top plate and bottom plate. The structure further includes a first wire within a wiring level below the three plate MIM capacitor connected to the first via group, a second wire within a wiring level above the three plate MIM capacitor connected to the second via group, and a third wire within a wiring level above the three plate MIM capacitor connected to the third via group.

In another embodiment of the present invention, a three plate MIM capacitor structure is claimed. The structure includes a three plate MIM capacitor comprising a bottom plate, a middle plate, and a top plate. The structure further includes a via matrix normal to the bottom plate, the middle plate, and the top plate. The via matrix includes a first via group that includes vias that are adjacent to the bottom plate, middle plate, and top plate. The via matrix a second via group that includes vias that are configured to contact only the middle plate. The via matrix also includes a third via group that includes vias that are configured to contact only the top plate and bottom plate. The structure further includes a first wire within a wiring level above the three plate MIM capacitor connected to the first via group, a second wire within a wiring level below the three plate MIM capacitor connected to the second via group, and a third wire within a wiring level below the three plate MIM capacitor connected to the third via group.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 1:
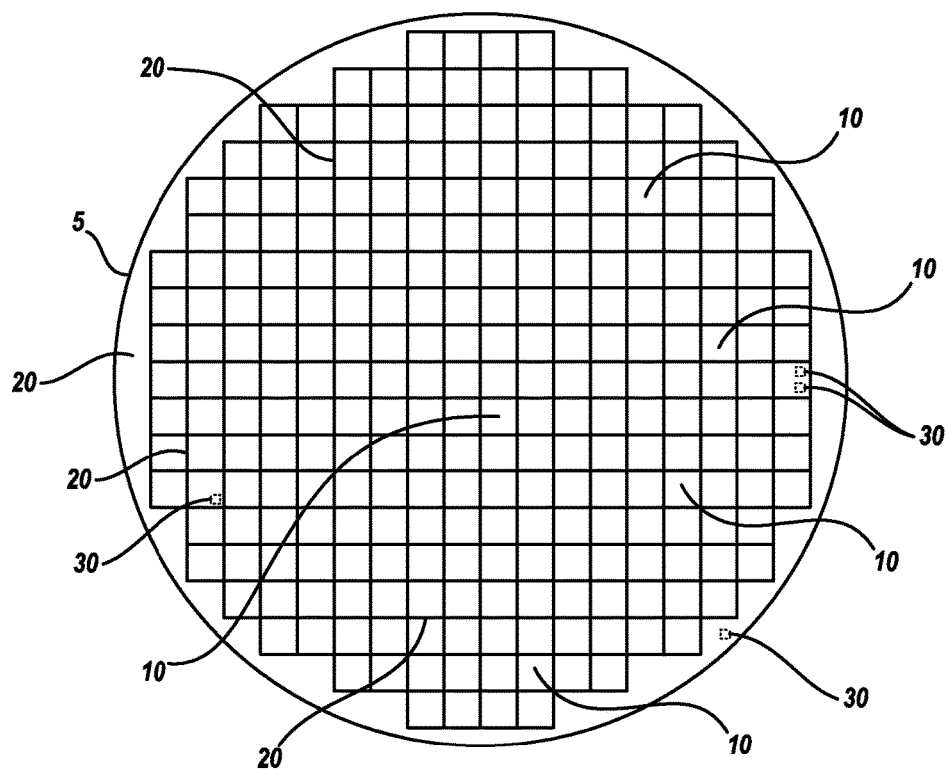
FIG. 1 depicts a semiconductor wafer, in accordance with various embodiments of the present invention.

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention relate to a three plate MIM capacitor test structure within a semiconductor device. The three plate MIM test structure includes a three plate MIM, a first test wire in a metal layer above/below the three plate MIM, a second test wire below/above the three plate MIM, a third test wire below/above the three plate MIM, a first via connected to the first test wire, a second via connected to a middle plate of the three plate MIM, and a third via connected to the top and bottom plates of the three plate MIM.

The three plate MIM test structure verifies the operational integrity of at least one via that extends through one or more of the three plates of the MIM capacitor by applying an electric potential to the first test wire, applying ground potential or an opposite polarity potential to both the second test wire and the third test wire, and detecting leakage current across the first test wire and the second and third test wires or detecting leakage current across the second test wire and the third test wire. If leakage current is detected, a short is present within the three plate MIM test structure. The operational integrity or structural component of the three plate MIM test structure may be indicative of operational integrity or structural component integrity of a three plate MIM within a functional area of the semiconductor device. In other words, for example, if a short is present in the three plate MIM test structure, a short is more apt to be present in the functional area of the semiconductor device and, inversely, if a short is not present in the three plate MIM test structure, a short is less apt to be present in the functional area of the semiconductor device. As such, the three plate MIM test structure may be utilized in semiconductor device quality and reliability studies. For example, if a short is detected in the three plate MIM test structure, the semiconductor device and/or an electronic device connected thereto, may be excluded from further movement within the stream of commerce.

Referring now to the figures, wherein like components are labeled with like numerals, exemplary structures of a semiconductor device, in accordance with embodiments of the present invention are shown, and will now be described in greater detail below. The specific number of components depicted in the figures and the cross section orientation was chosen to best illustrate the various embodiments described herein.

FIG. 1 depicts a particular example of a semiconductor structure, as a semiconductor wafer 5 with various regions, in accordance with various embodiments of the present invention. Wafer 5 may include a plurality of chips 10 separated by kerfs 20. Each chip 10 may include an active region wherein micro-devices, such as transistors, wiring lines, input-output contacts, or the like, may be built using applicable microfabrication process steps such as doping or ion implantation, etching, deposition of various materials, photolithographic patterning, electroplating, etc. Wafer 5 may further comprise one or more testing regions 30. In various embodiments, the one or more testing regions 30 may be included within the active region of a chip 10 and/or may be included within various kerf 20 locations. The kerf 20 may include the scribe between each chip 10 and/or the outside area of the wafer 5 where a full chip 10 may not be formed. Upon when the chips 10 are cut from the wafer 5, each independent chip 10 may be referred to as a die. For clarity, in various embodiments, chip 10 may be diced or un-diced from wafer 5.

Figure 2:
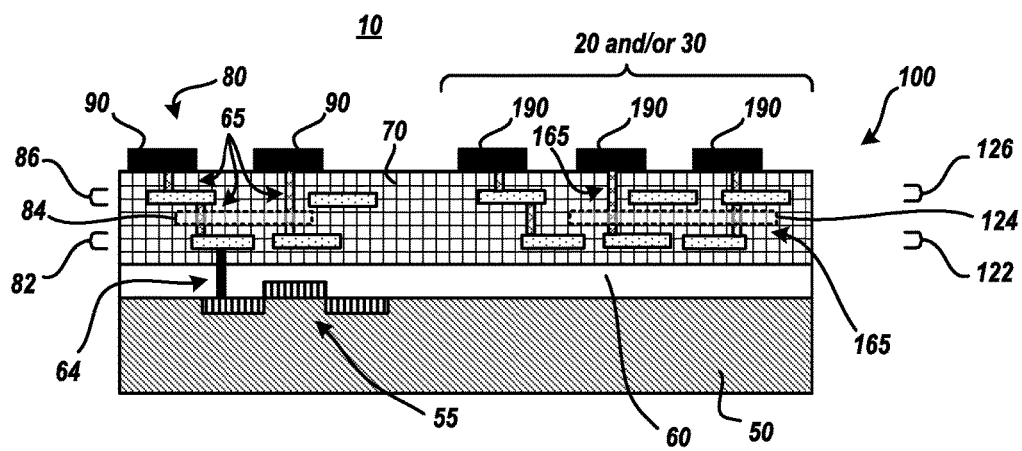
FIG. 2 depicts a cross section view of a semiconductor device that includes a three plate test MIM capacitor structure, in accordance with various embodiments of the present invention.

Referring to FIG. 2 which depicts a cross section view of a particular semiconductor structure, as a chip 10, in accordance with various embodiments of the present invention. The chip 10 may include a semiconductor substrate 50, a front end of the line (FEOL) layer(s) 60 upon the substrate 50, and a back end of the line (BEOL) layer(s) 70 upon the FEOL layer 60.

The semiconductor substrate 50 may include, but is not limited to: any semiconducting material such conventional Si-containing materials, Germanium-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. In various embodiments, substrate 50 may be, for example, a layered substrate (e.g. silicon on insulator) or a bulk substrate.

In various embodiments, micro-devices 55 may be formed upon or within the substrate 50. Devices 55 and the process of device 55 fabrication are well known in the art. Micro-devices 55 may be for example, a diode, field effect transistor (FET), metal oxide FET (MOSFET), fin FET, or any suitable combination thereof. Likewise, micro-devices 55 also may be components of the aforementioned, such as a gate, fin, source, drain, channel, etc. that when combined form a complete micro-device. For clarity, though one micro-device 55 is shown, there are typically numerous micro-devices 55 included within active regions of each chip 10. In certain embodiments, micro-devices 55 may be formed within substrate 50. For example, a source and drain of a transistor may be formed within substrate 50. To electrically isolate various devices 55 from another device 55, chips 10 may include isolation regions (not shown) formed upon and/or within substrate 50 (e.g. an isolation region may electrically isolate an n-FET device 55 from a p-FET device 55, etc.).

The FEOL layer 60 is the layer of chip 10 that generally includes individual devices 55 (e.g. transistors, capacitors, resistors, etc.) patterned in or upon substrate 50. For example, FinFETs may be implemented in FEOL layer 60 with gate first or gate last FinFET fabrication process techniques. The FEOL layer 60 may include devices 55, one or more dielectric layers, vias 64 to electrically connect device 55 to BEOL wiring layers, etc. The BEOL layer 70 is the layer of chip 10 including one or more wiring, and associated wiring dielectric levels, formed by known wiring fabrication techniques utilizing known materials. The BEOL wiring may be formed as various wiring lines at each wiring level. For example, wiring level 82 may be formed, followed by wiring level 86 that is generally above wiring level 82. BEOL layer 70 may further include multiple vertical interconnect accesses (vias) 65 to electrically connect different wiring levels or to connect a wiring line to an input output (I/O) contact pad 90 and may further include multiple vias 64 to electrically connect a wiring level to a micro-device 55. For clarity, therefore, there may be two types of vias within chip 10: one type that connects or otherwise contacts a wiring line to a micro-device 55 and one type that connects or otherwise contacts two different wiring levels or that connects or otherwise contacts a wiring line and an I/O contact pad 90. For clarity, though two wiring levels 82 and 86 are shown, chip 10 may include numerous wiring levels.

BEOL layer 70 may also include multiple dielectric layers that may be utilized to form wiring lines within each wiring level 82 and 86. For example, BEOL layer 70 may include a first dielectric layer generally utilized to form wiring layer 82 and a second dielectric layer generally utilized to form wiring level 86, etc. In various embodiments, wiring lines may be formed, for example, utilizing photolithography, etching, and deposition techniques. More specifically, a pattern may be produced by applying a masking layer such as a photoresist or photoresist with an underlying hardmask, to a surface to be etched (e.g., a dielectric layer); exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. Such etching techniques may form wiring line trenches that may be filled, deposited therewithin, etc. with an electrically conductive material to form the wiring line. In certain embodiments, multiple etchings and depositions may be employed to form one or more wiring lines within each wiring level 82, 86, etc.

The I/O contact pads 90 are further configured to connect, directly or indirectly, with respective contact pads of a system board within an electronic data handling device. The electronic data handling device may be a personal computer, server, cash machine, kiosk, infotainment system, or the like.

Chip 10 may further include a three-plate MIM capacitor 84 located between wiring levels 82 and 86. The three plate MIM capacitor 84 includes a top plate, middle plate, and bottom plate, each separated by dielectric material(s) of BEOL layer 70. Each plate of capacitor 84 may be electrically connected to one or more wire lines within wire level 86 or to one or more wire lines within wire level 82 by one or more vias 65. As such, one or more vias 65 may extend completely through the three plates of MIM capacitor 84.

A three-plate MIM capacitor test structure 100 is located within a test region 30 that is within the boundary of chip 10 and/or within kerf 20 of wafer 5. Test structure 100 includes a three-plate MIM capacitor 124 located between wiring levels 122 and 126. The three plate MIM capacitor 124 includes a top plate, middle plate, and bottom plate, each separated by dielectric material(s) of BEOL layer 70. Each plate of capacitor 124 may be connected to one or more wire lines within wire level 122 or to one or more wire lines within wire level 126 by one or more vias 165. Via 165 is a particular type of via that connects respective wiring lines in different wiring levels or connects a wiring line to a test pad 190. For clarity, one or more vias 165 may extend completely through the three plates of MIM capacitor 124. In an embodiment, wiring level 82 is the same wiring level as wiring level 122 and wiring level 86 is the same wiring level as wiring level 126. That is, a top and bottom surface of a wiring line in wire level 86 may be coplanar with a respective top and bottom surface of a wiring line in wire level 126.

For clarity, the one or more dielectric materials of BEOL layer 70 between the top plate, middle plate, and bottom plate of the MIM capacitor 84 are typically high-K material(s), such as HfO2-Al2O3, or the like, as is known in the art, while the one or more dielectric material(s) at the same level as the MIM capacitor 84, between wiring level 82 and wiring level 86, outside of the MIM capacitor 84 are typically lower K material(s), such as SiO2, or SiCOH, or the like, as is known in the art.

For clarity, there are two options to connect a plate of the MIM 124 to a test pad 190. The first option is to connect the via 165 that contacts the plate of the MIM 124 to one or more wiring lines that is connected to the test pad 190. The second option is to connect the via 165 that contacts the plate of the MIM 124 directly to the test pad 190.

Test structure 100 may further include various test pads 190. Each test pad 190 is configured to make connection with a probe that may be internal to or external to chip 10. Test pad 190 may be a similar structure relative to I/O contact 90 or may be a different structure. For example, test pads 190 may be exposed or otherwise accessible portions of respective wiring lines within one or more particular wiring levels. The probe may apply a load, such as a voltage, to a wiring line and/or a via 165 that which partially extends through or entirely extends through MIM capacitor 124.

In an embodiment, I/O contact 90 and/or test pad 190 may be fabricated by forming a opening in the material(s) of BEOL layer 70, forming a seed layer, performing an electrochemical plating (ECP) to fill the opening with a metallic material, and then performing a CMP to remove excess metallic material. Additional metal layers or bumps (e.g. solder bumps, etc.) may further be formed upon I/O contact 90 to allow for subsequent interconnect with another electrical package (e.g. an interposer, system board, or the like).

Figure 3A:
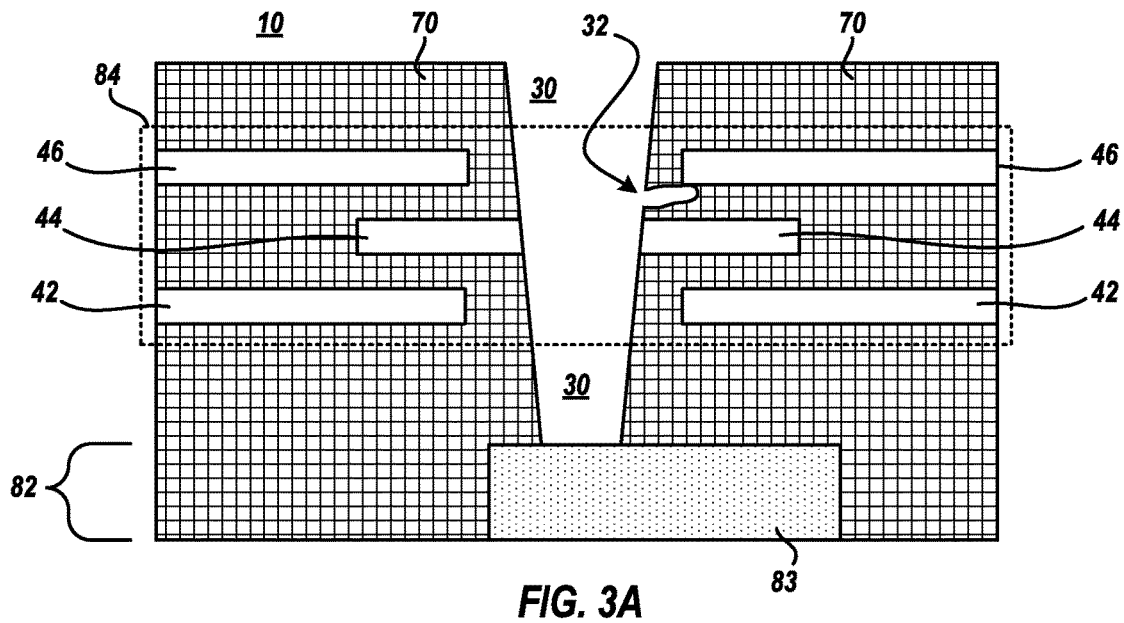
FIG. 3A-FIG. 3B depicts detailed cross section views of a semiconductor device that includes a shorted three plate MIM capacitor as a result of a via defect, in accordance with various embodiments of the present invention.
Figure 3B:
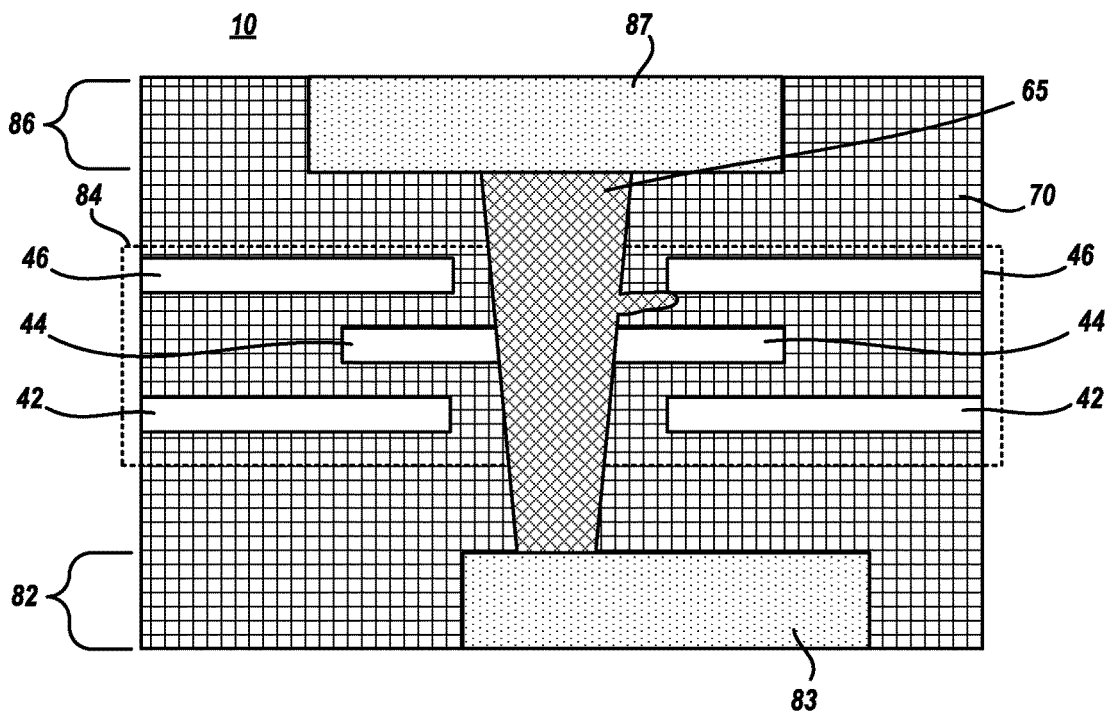

Referring to FIG. 3A and FIG. 3B which depict cross section views of chip 10, in accordance with various embodiments of the present invention. The MIM capacitor 84 located between wiring levels 82 and 86 and includes a top plate 46, middle plate 44, and bottom plate 42, each separated by dielectric material(s) of BEOL layer 70.

As shown in FIG. 3A and in FIG. 3B, a via 65 may be formed by initially forming a vertically orientated via trench 30 within the dielectric material(s) of BEOL layer 70. The via trench 30 may expose a portion of a wiring line 83 within wiring level 82 so as to allow for the via 65 to contact the wiring line 83. The trench 30 may be formed by etching multiple layers of the dielectric material(s) of BEOL layer 70. Due to different material properties of the multiple layers, the via etch may undesirably traverse horizontally, and thereby form a pocket 32 located outside a predetermined vertical bound of the trench 30. Prior to forming the via 65 within the trench 30, a liner (not shown) may be formed upon the vertical trench sidewall to attempt to create the desired vertical bound of the trench. However, the liner may not effectively fill or cover the pocket 32 and conductive material may be formed within the trench 30 and pocket 32 during via 65 formation. The via 65 may be subsequently formed by forming a seed within trench 30 and performing an ECP to fill the opening with a metallic material, by deposition, or by other known via formation techniques. The via 65 is configured to contact at least one level within the MIM capacitor 84. For example, via 65 is configured to only contact middle plate 44. However, because of the existence of pocket 32, the material of via 65 may also contact top plate 46, thus shorting the top plate 46 and middle plate 44 of MIM capacitor 84. In another defect occurrence, shorting of MIM capacitor 84 may also occur during operation of the chip 10 when the material of via 65 leaks outside the configured boundary of the via trench 30 and contacts a plate of the of MIM capacitor 84, that which via 65 was not configured to contact. For clarity, pocket 32 may form between middle plate 44 and top plate 46 and/or between middle plate 44 and bottom plate 42.

As shown in FIG. 3B, a wiring line 87 may be formed within wiring level 86. The wiring line 87 may be formed by known fabrication techniques with known materials. For example, an dielectric layer may be applied to the top surface of the structure of FIG. 3A. The dielectric layer may be patterned to form a wiring line trench and the wiring line 87 may be formed therewithin. The wiring line 87 may connect to via 65. As such, wiring line 87 and wiring line 83 may contact via 65 that contacts bottom plate 42, middle plate 44, and/or upper plate 46, as desired. In some implementations, a dual damascene fabrication process may be used to form wiring line 87 and via 65 simultaneously, as is known in the art.

The number of vias 65 and wiring lines 83, 87 within a chip 10 and within wafer 5 may be so numerous that it becomes difficult to test whether there are shorts within a particular MIM capacitor 84. As such, a test structure 100 may be included within one or more chips 10 and/or within wafer 5 in order to verify the operational integrity or structural components of the test structure 100. The test structure 100 indicates the operational integrity or structural component integrity of three plate MIM 84 within the functional area of the chip 10 and/or wafer 5. The term functional area utilized herein shall mean the area of the semiconductor structure wherein the three plate MIM 84 is located and wherein the three plate MIM 84 is utilized as a decoupling capacitor between wiring levels 82, 86. If as short is detected in test structure 100, a short is more apt to be present in the functional area of chip 10 and/or wafer 5, and inversely, if a short is not present in the three plate MIM test structure 100, a short is less apt to be present in the functional area of the chip 10 and/or wafer 5. As such, the three plate MIM test structure 100 may be utilized in semiconductor device quality and reliability studies. For example, if a short is detected in the three plate MIM test structure 100, the chip 10, wafer 5, and/or an electronic device connected thereto, may be excluded from further movement within the stream of commerce.

If a short is not initially detected, test structure 100 may be used to further study MIM capacitor reliability by applying voltages to different vias or via groups for extended period of time to determine if any conducting materials can be driven out of the via boundary causing a MIM capacitor short. By using applying different voltages for different period of time, a reliability kinetic study can be performed to enable MIM lifetime projections.

Figure 4:
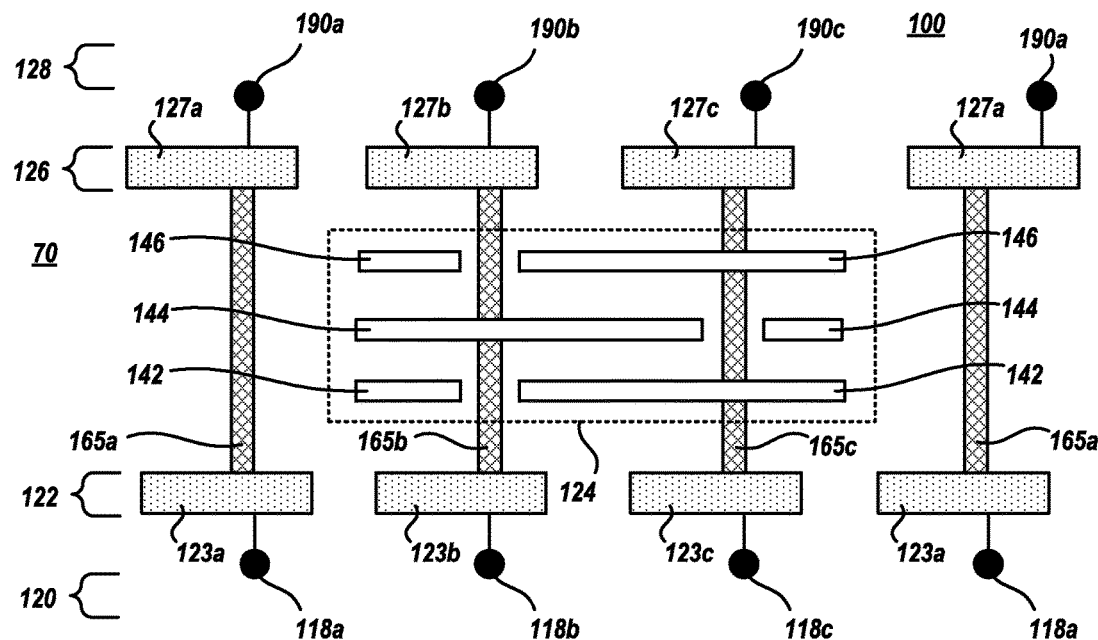
FIG. 4 depicts a cross sectional view of a three plate MIM capacitor test structure, in accordance with various embodiments of the present invention.

FIG. 4 depicts a cross sectional view of three plate MIM capacitor test structure 100, in accordance with various embodiments of the present invention. Test structure 100 may include a three plate MIM 124, a test wire 123a, a test wire 127b, a test wire 127c, a via 165a connected to test wire 123a, a via 165b connected to a middle plate 144 of the three plate MIM 124, and a via 165c connected to a top plate 146 and a bottom plate 142 of the three plate MIM 124. Test structure 100 may also include a test pad 190a connected, directly or indirectly, to via 165a; a test pad 190b connected, directly or indirectly, to via 165b; and a test pad 190c connected, directly or indirectly, to via 165c.

Test wire 127a may be connected to via 165a at the proximate end of via 165a relative to test wire 123a. In this implementation, test wire 127a may be connected to test pad 190a. Alternatively, via 165a may be connected directly to test pad 190a at the proximate end of via 165a relative to test wire 123a. Test wire 123b may be connected to via 165b at the proximate end of via 165b relative to test wire 127b. In this implementation, test wire 123b may be connected to node 118b, such as a wiring line, or the like. Alternatively, via 165b may be connected directly to node 118b at the proximate end of via 165b relative to test wire 127b. Likewise, test wire 123c may be connected to via 165c at the proximate end of via 165c relative to test wire 127c. In this implementation, test wire 123c may be connected to node 118c, such as a different wiring line. Alternatively, via 165c may be connected directly to node 118c at the proximate end of via 165c relative to test wire 127c. Similarly, via 165a directly, or indirectly by test wire 123a, may be connected to a node 118a, such as a different wiring line or the like, below the MIM 124.

Wiring level 126 and wiring level 128 are located above the MIM 124 and wiring level 120 and wiring level 122 are located below the MIM 124. Test wire 123a may be located in wiring level 120 or wiring level 122; test wire 127b may be located in wiring level 126 or wiring level 128; and test wire 127c may be located in wiring level 126 or wiring level 128, as is depicted in FIG. 4. Node 118a, node 118b, and/or node 118c may be located in wiring level or generally below test wires 123a, 123b, and 123c, respectively.

For clarity, the relative positioning of test wires above MIM 124 and the test wires below MIM 124 may be switched. For example, test wire 123a may be located in wiring level 126 or wiring level 128; test wire 127b may be located in wiring level 120 or wiring level 122; and test wire 127c may be located in wiring level 120 or wiring level 122.

In a particular embodiment, as shown in FIG. 4, test structure 100 includes three test wires 123a, 127b, and 127c. In this embodiment, test wire 123a is connected to via 165a that is not connected with any of the plates 142, 144, or 146 of the MIM 124, test wire 127b is connected to via 165b that is connected to only plate 144 of the MIM 124, and test wire 127c is connected to via 165c that is connected to only plate 142 and to plate 146 of the MIM 124.

In another embodiment, test structure 100 includes four test wires 123a, 127b, 127c' (not shown in FIG. 4), and 127c" (not shown in FIG. 4). In this embodiment, test wire 123a is connected to via 165a that is not connected with any of the plates 142, 144, or 146 of the MIM 124, test wire 127b is connected to via 165b that is connected to only plate 144 of the MIM 124, test wire 127c' is connected to a via 165c' that is connected to only plate 146 of the MIM 124, and test wire 127c" is connected to a via 165c" that is connected to only plate 142 of the MIM 124. Test wire 127c' and 127c" may be respectively located above or below the MIM 124. For example, test wire 123a and test wire 127c' may be located below the MIM 124 and test wire 127b and 127c" may be located above the MIM 124, test wire 123a may be located below the MIM 124 and test wire 127*b*, 127*c*'', and 127*c*''' may be located above the MIM 124, or the like.

The three plate MIM test structure 100 verifies the operational integrity of at least one via 165*a*, 165*b*, 165*c*, 165*c*', or 165*c*'' that extends through one or more of the three plates 142, 144, 146 of the MIM capacitor 124 by applying a potential to one of the vias 165*a*, 165*b*, 165*c*, 165*c*', or 165*c*'' and applying ground potential or opposing potential to one other of the vias 165*a*, 165*b*, 165*c*, 165*c*', or 165*c*'' and detecting leakage current between different vias. If leakage current is detected, a short is present within the three plate MIM test structure 100.

Figure 5A:
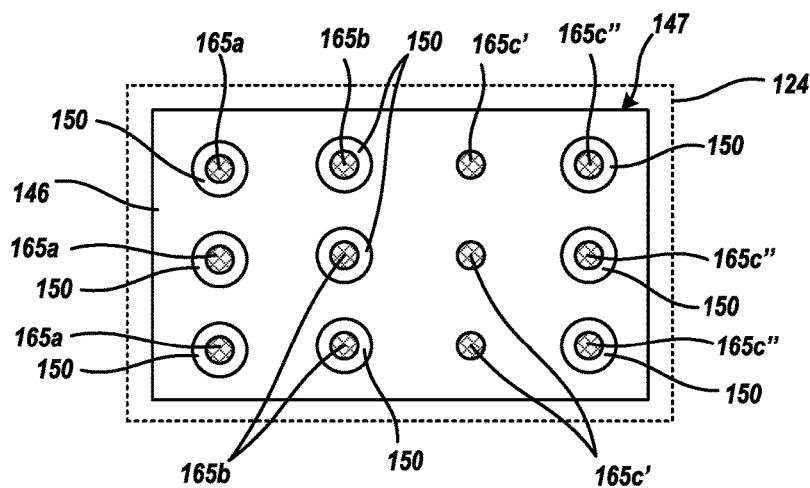
FIG. 5A-FIG. 5C depict normal views of each plate of a three plate MIM capacitor test structure, in accordance with various embodiments of the present invention.

FIG. 5A depicts a normal view, such as a top view or bottom view, of plate 146 of MIM capacitor 124. In an exemplary embodiment depicted in FIG. 5A-FIG. 5C, test structure 100 includes four test wires 123*a*, 127*b*, 127*c*', and 127*c*'' (not shown in FIG. 5A-FIG. 5C) and respective vias 165*a*, 165*b*, 165*c*', and 165''. Plate 146 includes clearances 150 each clearance 150 generally aligned with an associated via to allow the via to pass through plate 146 without making contact with plate 146. The clearance 150 allows for the plate 146 to be insulated from the via passing through the clearance 150. As depicted in FIG. 5A, plate 146 is connected to one or more vias 165*c*' and plate 146 is insulated from via 165*a*, via 165*b*, and via 165*c*''.

Figure 5B:
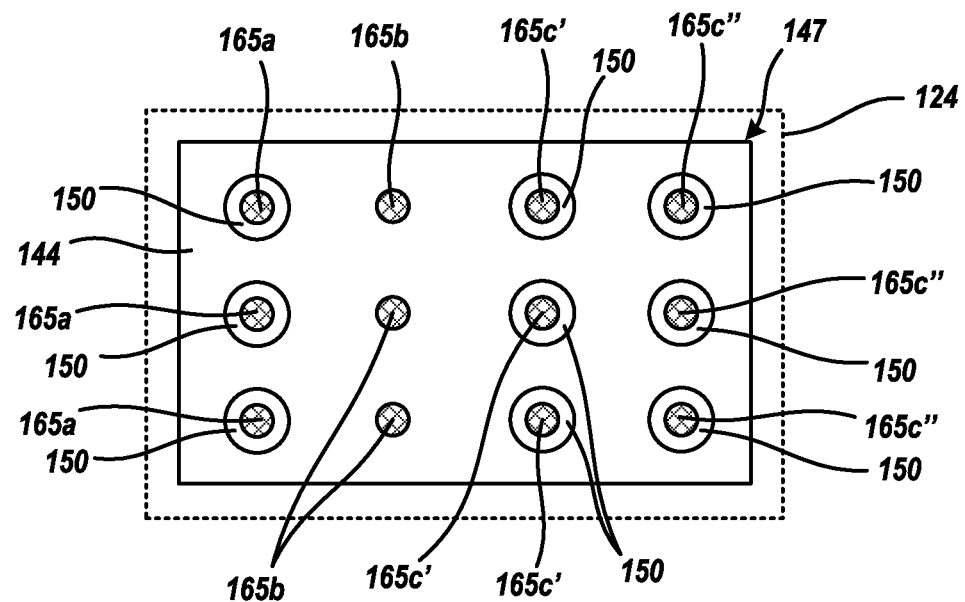

FIG. 5B depicts a normal view, such as a top view or bottom view, of plate 144 of MIM capacitor 124. Plate 144 includes clearances 150 each clearance 150 generally aligned with an associated via to allow the via to pass through plate 144 without making contact with plate 144. The clearance 150 allows for the plate 144 to be insulated from the via passing through the clearance 150. As depicted in FIG. 5B, plate 144 is connected to one or more vias 165*b* and plate 144 is insulated from via 165*a*, via 165*c*', and via 165*c*''.

Figure 5C:
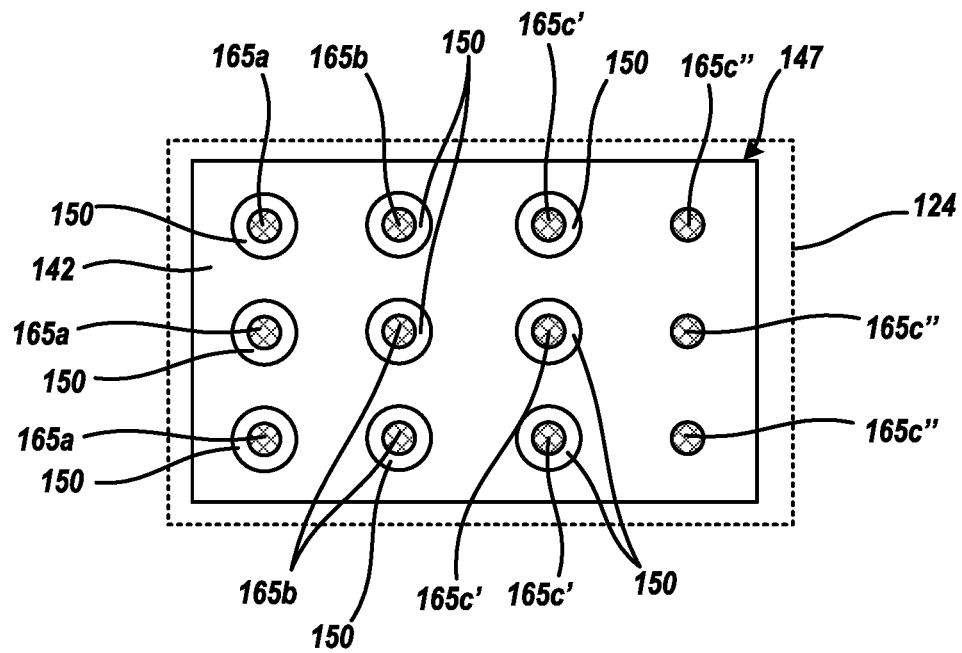

FIG. 5C depicts a normal view, such as a top view or bottom view, of plate 142 of MIM capacitor 124. Plate 142 includes clearances 150 each clearance 150 generally aligned with an associated via to allow the via to pass through plate 142 without making contact with plate 142. The clearance 150 allows for the plate 142 to be insulated from the via passing through the clearance 150. As depicted in FIG. 5C, plate 142 is connected to one or more vias 165*c*'' and plate 142 is insulated from via 165*a*, via 165*b*, and via 165*c*'.

In the one or more embodiments depicted in FIG. 5A-FIG. 5C, the MIM 124 includes vias 165*a*, 165*b*, 165*c*', and 165*c*''. The vias 165*a* pass through each of the plates 142, 144, 146 without contacting the plates 142, 144, 146; the vias 165*b* pass through each of the plates 142, 146 without contacting the plates 142, 146 and contacts plate 144; the vias 165*c*' pass through each of the plates 142, 144 without contacting the plates 142, 144 and contacts plate 146; and the vias 165*c*'' pass through each of the plates 144, 146 without contacting the plates 144, 146 and contacts plate 142.

In an embodiment, groups of multiple vias 165 may be aligned in an orientation orthogonal to a normal length of the plates. For example, vias 165*a*, vias 165*b*, vias 165*c*', and vias 165*c*'' are aligned in respective orientations orthogonal to side 147 of the plates. Generally, numerous vias 165 may be arranged as a via grid across the normal view of MIM 124, as depicted in FIG. 5A-FIG. 5C. Each group of vias 165*a*, vias 165*b*, vias 165*c*', and vias 165*c*'' may be arranged in distinct one or more column orientations, one or more row orientations, or one or more diagonal orientations within the via grid. For example, as is shown in FIG. 5A-FIG. 5C vias 165*a*, vias 165*b*, vias 165*c*', and vias 165*c*'' are arranged in distinct one or more column orientations.

In various embodiments, each plate 142, 144, and 146 has the same respective normal length and depth dimensions; has the same cross sectional height dimension; two of the three plates 142, 144, and 146 have the same respective normal length and depth dimensions; the three plates 142, 144, and 146 have the different normal length and depth dimensions; and/or middle plate 144 has a smaller respective normal length and depth dimensions relative to plates 142, 146; or the like.

Figure 6A:
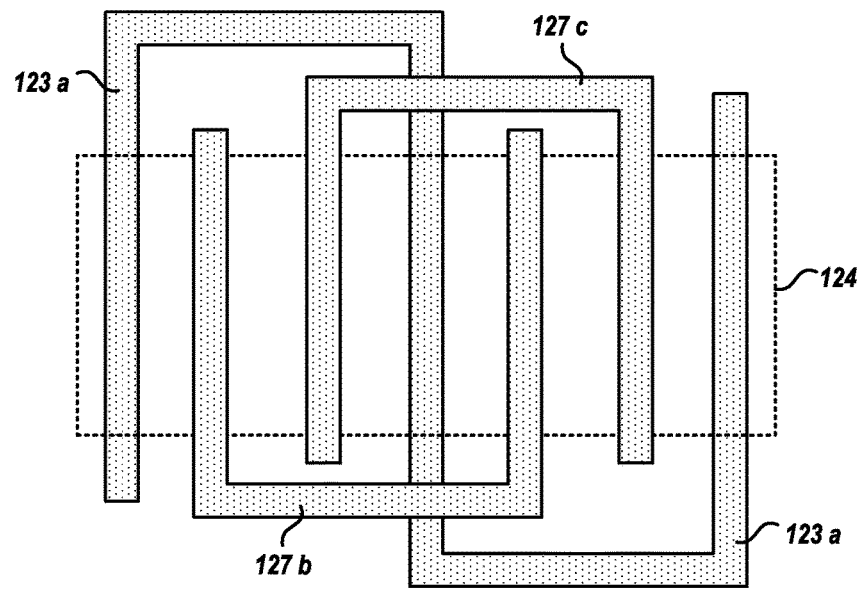
FIG. 6A and FIG. 6B depicts normal views of wires within metal layers of a three plate MIM capacitor test structure, in accordance with various embodiments of the present invention.

FIG. 6A depicts a normal view of wires 123*a*, 127*b*, and 127*c* within associated metal layers of a three plate MIM capacitor test structure 100, in accordance with various embodiments of the present invention. FIG. 6A depicts test wire 123*a* below the MIM capacitor 124, test wire 127*b* above the MIM capacitor 124, and test wire 127*c* above the MIM capacitor 124. In an embodiment, test wire 123*a* is serpentinely routed such that test wire 123*a* traverses the MIM capacitor in multiple instances. For example, test wire 123*a* traverses from the MIM capacitor 124 front to the MIM capacitor 124 back; traverses in a parallel direction to the MIM capacitor 124 back; traverses from the MIM capacitor 124 back to the MIM capacitor 124 front; traverses in a parallel direction to the MIM capacitor 124 front; and again traverses from the MIM capacitor 124 front to the MIM capacitor 124 back, as is exemplary depicted in FIG. 6A.

In an embodiment, test wire 127*b* is serpentinely routed such that test wire 127*b* traverses the MIM capacitor in multiple instances. For example, test wire 127*b* traverses from the MIM capacitor 124 back to the MIM capacitor 124 front; traverses in a parallel direction to the MIM capacitor 124 front; and traverses from the MIM capacitor 124 front to the MIM capacitor 124 back, as is exemplary depicted in FIG. 6A. Likewise, test wire 127*c* is serpentinely routed such that test wire 127*c* traverses the MIM capacitor in multiple instances. For example, test wire 127*c* traverses from the MIM capacitor 124 front to the MIM capacitor 124 back; traverses in a parallel direction to the MIM capacitor 124 back; and traverses from the MIM capacitor 124 back to the MIM capacitor 124 front, as is exemplary depicted in FIG. 6A. Though the traversal direction depicted in FIG. 6A is generally in a front-back direction, the traversal direction may further be in a left-right direction or a diagonal direction In an embodiment, the test wire 127*b* and test wire 127*c* may each have two parallel portions connected by an orthogonal portion. The orthogonal portion of test wire 127*b* and the orthogonal portion of test wire 127*c* may be positioned on opposing sides of MIM capacitor 124. For example, the orthogonal portion of test wire 127*b* is located in front of the MIM capacitor 124 and the orthogonal portion of test wire 127*c* is located in back of MIM capacitor 124. A single parallel portion of test wire 127*b* may be located between the parallel portions of test wire 127*c*. In other words, in this embodiment, test wire 127*b* and test wire 127*c* may be positioned as interlocking "V," "C," "U," or similar shapes.

Figure 6B:
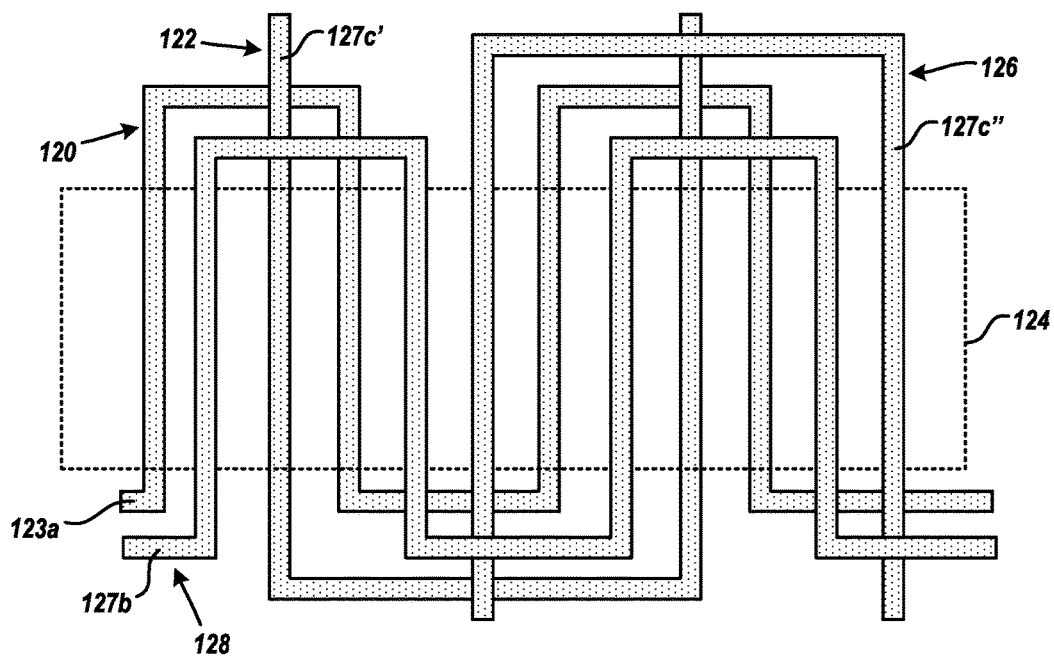

FIG. 6B depicts a normal view of wires 123*a*, 127*b*, 127*c*', and 127*c*'' within associated metal layers 120, 122, 126, or 128 of a three plate MIM capacitor test structure 100, in accordance with various embodiments of the present invention. FIG. 6A depicts test wire 123*a* below the MIM capacitor 124 in wiring level 123*a*, test wire 127*b* above the MIM capacitor 124 in wiring level 128, test wire 127*c*' below the MIM capacitor 124 in wiring level 122, and test wire 127*c*'' above the MIM capacitor 124 in wiring level 126.

In an embodiment, test wire 123*a* is serpentinely routed such that test wire 123*a* traverses the MIM capacitor in multiple instances. For example, test wire 123*a* traverses in one or more instances from the MIM capacitor 124 front to the MIM capacitor 124 back; traverses in a parallel direction to the MIM capacitor 124 back outsize of the boundary of the MIM capacitor 124; traverses from the MIM capacitor 124 back to the MIM capacitor 124 front; traverses in a parallel direction to the MIM capacitor 124 front outside the boundary of the MIM capacitor 124; and again traverses from the MIM capacitor 124 front to the MIM capacitor 124 back, as is exemplary depicted in FIG. 6B.

In an embodiment, test wire 127*b* is serpentinely routed such that test wire 127*b* traverses the MIM capacitor in multiple instances. For example, test wire 127*b* traverses in one or more instances from the MIM capacitor 124 front to the MIM capacitor 124 back; traverses in a parallel direction to the MIM capacitor 124 back outsize of the boundary of the MIM capacitor 124; traverses from the MIM capacitor 124 back to the MIM capacitor 124 front; traverses in a parallel direction to the MIM capacitor 124 front outside the boundary of the MIM capacitor 124; and again traverses from the MIM capacitor 124 front to the MIM capacitor 124 back, as is exemplary depicted in FIG. 6B.

In an embodiment, test wire 127*c'* is serpentinely routed such that test wire 127*c'* traverses the MIM capacitor in multiple instances. For example, test wire 127*c'* traverses from the MIM capacitor 124 back to the MIM capacitor 124 front; traverses in a parallel direction to the MIM capacitor 124 front outside of the boundary of the MIM capacitor 124; and traverses from the MIM capacitor 124 front to the MIM capacitor 124 back, as is exemplary depicted in FIG. 6B. Though the traversal direction of test wire 127*c*, depicted in FIG. 6B, is generally in a back-front direction, the traversal direction may alternatively be in a left-right direction or a diagonal direction as is appropriate.

In an embodiment, test wire 127*c"* is serpentinely routed such that test wire 127*c"* traverses the MIM capacitor in multiple instances. For example, test wire 127*c"* traverses from the MIM capacitor 124 front to the MIM capacitor 124 back; traverses in a parallel direction to the MIM capacitor 124 back outside of the boundary of the MIM capacitor 124; and traverses from the MIM capacitor 124 back to the MIM capacitor 124 front, as is exemplary depicted in FIG. 6B. Though the traversal direction of test wire 127*c*, depicted in FIG. 6B, is generally in a front-back direction, the traversal direction may alternatively be in a left-right direction or a diagonal direction as is appropriate.

In an embodiment, the test wire 127*c'* and test wire 127*c"* may each have two parallel portions connected by an orthogonal portion. The orthogonal portion of test wire 127*c'* and the orthogonal portion of test wire 127*c"* may be positioned on opposing sides of MIM capacitor 124. For example, the orthogonal portion of test wire 127*c'* is located in front of the MIM capacitor 124 and the orthogonal portion of test wire 127*c"* is located in back of MIM capacitor 124. A single parallel portion of test wire 127*c'* may be located between the parallel portions of test wire 127*c"*. In other words, in this embodiment, test wire 127*c'* and test wire 127*c"* may be positioned as interlocking "V," "C," "U," or similar shapes.

Though a single instance of test wire 123*a*, 123*b*, 127*c*, 127*c'*, and/or 127*c"* may be depicted in FIG. 6A-FIG. 6B, there may be multiple instances of such test wires. Though test wire 123*a*, 123*b*, 127*c*, 127*c'*, and/or 127*c"* are depicted as being in a particular wiring level either above or below MIM 124 in FIG. 6A-FIG. 6B, the test wire 123*a*, 123*b*, 127*c*, 127*c'*, and/or 127*c"* may be located in a wire level on the opposing side of MIM 124, relative to that depicted.

Figure 7:
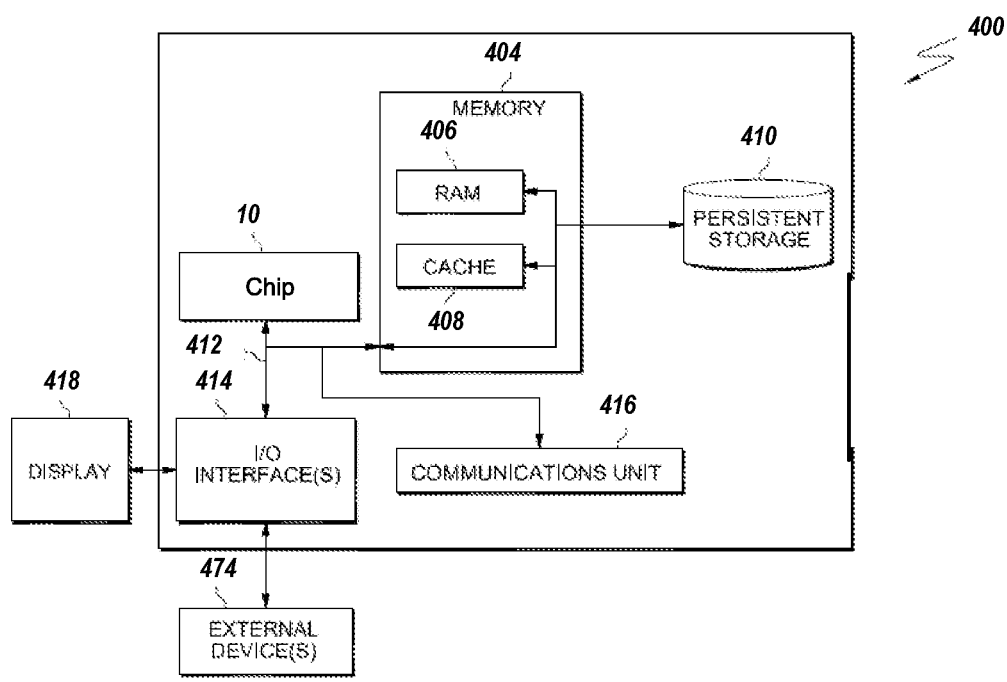
FIG. 7 depicts an exemplary data handling device that utilizes a semiconductor device that includes a three plate MIM capacitor test structure, in accordance with various embodiments of the present invention.

FIG. 7 depicts an exemplary electronic device 400 that utilizes a chip 10, in the form of a die that includes a three plate MIM capacitor test structure 100 and that is connected directly or indirectly to a system board of the device 400, in accordance with various embodiments of the present invention. It should be appreciated that FIG. 7 provides only an illustration of one implementation of electronic device 400 that utilizes chip 10. Electronic device 400 may be a data handling device, personal computer, server, cash machine, kiosk, infotainment system, or the like.

Electronic device 400 includes communications bus 412, which provides communications between chip 10, memory 404, persistent storage 410, communications unit 416, and input/output (I/O) interface(s) 414. Chip 10 may call program instructions stored in memory 404, as is known in the art. Memory 404 may be, for example, one or more random access memories (RAM) 406, cache memory 408, or any other suitable non-volatile or volatile storage device. Persistent storage 410 can include one or more of flash memory, magnetic disk storage device of an internal hard drive, a solid state drive, a semiconductor storage device, read-only memory (ROM), EPROM, or any other computer-readable tangible storage device that is capable of storing program instructions or digital information.

The media used by persistent storage 410 may also be removable. For example, a removable hard drive may be used for persistent storage 410. Other examples include an optical or magnetic disk that is inserted into a drive for transfer onto another storage device that is also a part of persistent storage 410, or other removable storage devices such as a thumb drive or smart card.

Communications unit 416 provides for communications with other electronic devices. Communications unit 416 includes one or more network interfaces. Communications unit 416 may provide communications through the use of either or both physical and wireless communications links. In other embodiments, electronic device 400 may be devoid of communications unit 416. Software may be downloaded to persistent storage 410 through communications unit 416.

I/O interface(s) 414 allows for input and output of data with other devices that may be connected to electronic device 400. I/O interface 414 may further provide a connection to other external devices such as a camera, mouse, keyboard, keypad, touch screen, and/or some other suitable input device. I/O interface(s) 414 may also connect to display 418.

Display 418 provides a mechanism to display data to a user and may be, for example, a computer monitor. Alternatively, display 418 may be integral to electronic device 400 and may also function as a touch screen.

Figure 8:
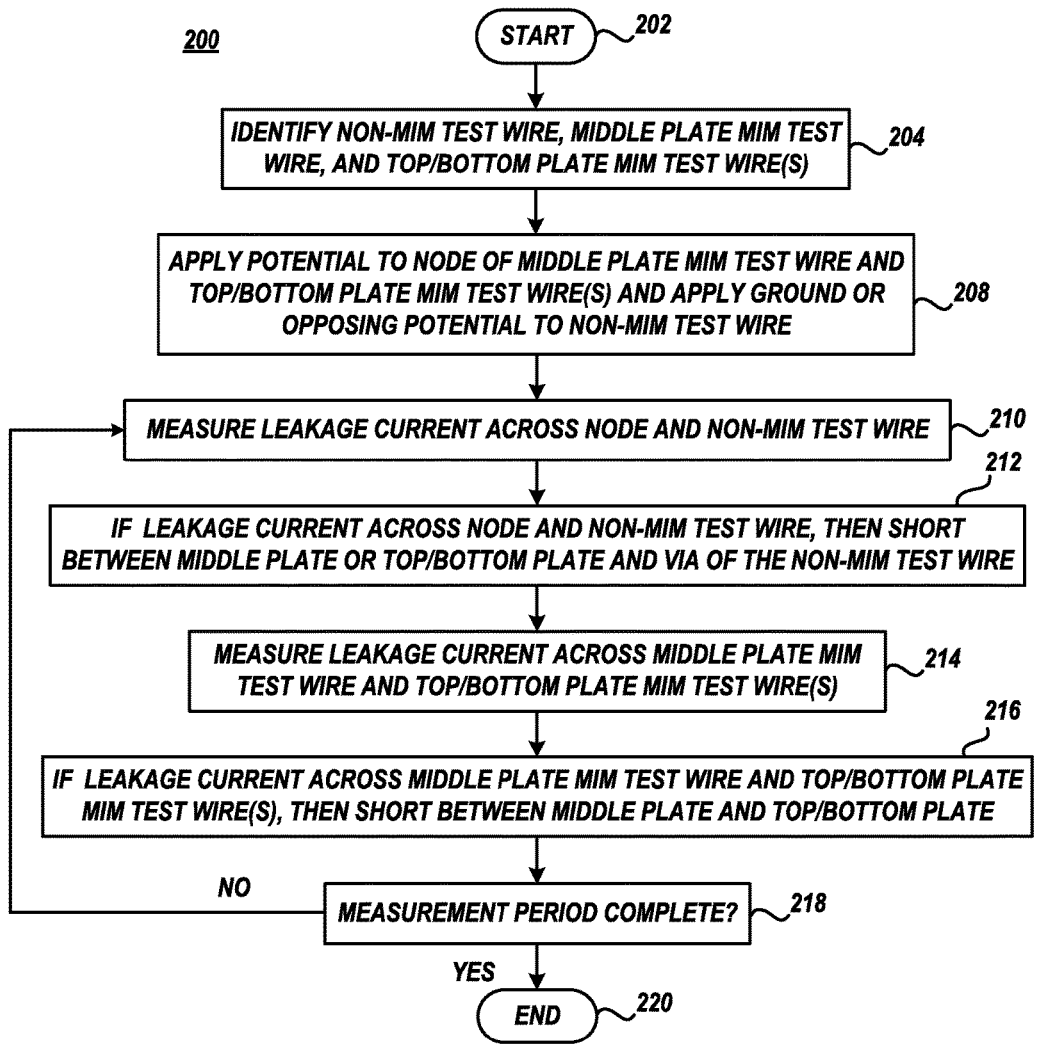
FIG. 8 depicts a flow diagram of a method of verifying the operational integrity of one or more vias that extend through one or more plates of a three plate MIM capacitor test structure, in accordance with various embodiments of the present invention.

FIG. 8 depicts a flow diagram of a method 200 of verifying the operational integrity of one or more vias 165 that extend through one or more plates 142, 144, 146 of a three plate MIM capacitor test structure 100, according to embodiments of the present invention. Method 200 may be utilized by device 400; by an entity that designs or fabricates wafer 5, chip 10; or the like to verify the operational integrity of functional three plate MIM capacitors 84 by performing one or more verification studies upon one or more three plate MIM capacitor test structures 100 within the applicable semiconductor structure.

Method 200 begins at block 202 and continues with identifying a non-MIM test wire, middle plate MIM test wire, and top/bottom plate MIM test wire(s) (block 204). The term non-MIM test wire is defined herein to be a test wire that is not connected by a via 165*a* with any plates 142, 144, or 146 of the MIM capacitor 124 within test structure 100. The term middle plate MIM test wire is defined herein to be a test wire that is connected by a via 165*b* with only middle plate 144 of the MIM capacitor 124 within test structure 100. The term top plate MIM test wire is defined herein to be a test wire that is connected by a via 165*c*' with only top plate 146 of the MIM capacitor 124 within test structure 100. The term bottom plate MIM test wire is defined herein to be a test wire that is connected by a via 165*c*'' with only bottom plate 142 of the MIM capacitor 124 within test structure 100. The term top and bottom plate MIM test wire is defined herein to be a test wire that is connected by a via 165*c* with both bottom plate 142 and top plate 146 of the MIM capacitor 124 within test structure 100. For example, test wire 123*a* may be identified as the non-MIM test wire, test wire 127*b* may be identified as the middle plate MIM test wire, and test wire 127*c* may be identified as the top and plate MIM test wire, test wire 127*c*' may be identified as the top plate MIM test wire, or test wire 127*c*'' may be identified as the bottom plate MIM test wire.

Method 200 may continue by applying electric potential to a node comprising the middle plate MIM test wire and the top/bottom plate MIM test wire(s) and applying ground potential or opposing potential to the non-MIM test wire (block 208). For example, a positive potential is applied to test wire 127*b* and to test wire 127*c* and a ground or negative potential is applied to test wire 123*a*. In another example, a negative potential is applied to test wire 127*b*, to test wire 127*c*', and to test wire 127*c*'' and a ground or positive potential is applied to test wire 123*a*. The amount of potential applied may be chosen to accelerate potential leakage of the material of the one or more vias 165 outside of the configured boundary of the one or more vias 165. The potentials applied to the test wires may be applied by an external device, such as a voltage source, to an associated test pad 190 that is respectively connected to a particular test wire or may be applied by chip 10 to each particular test wire.

Method 200 may continue with measuring leakage current across (1) the node of the middle plate MIM test wire and the top/bottom plate MIM test wire(s) and (2) the non-MIM test wire (block 210). For example, it is determined whether there is any of leakage current between (1) the node of test wire 127*b* and test wire 127*c* and (2) test wire 123*a*. In another example, is determined whether there is any of leakage current between (1) the node of test wire 127*b*, test wire 127*c*', and test wire 127*c*'' and (2) test wire 123*a*.

Method 200 may continue with determining that there is a short between the middle plate 144 or the top plate 146/bottom plate 142 and via 165*a* of the non-MIM test wire, if leakage current is detected across (1) the node of the middle plate MIM test wire and the top/bottom plate MIM test wire(s) and (2) the non-MIM test wire (block 212). For example, it is determined there is a short between middle plate 144, top plate 146, or bottom plate 142 and via 165*a* of wire 123*a*, if leakage current is detected between (1) the node of test wire 127*b* and test wire 127*c* and (2) test wire 123*a*. In another example, it is determined there is a short between middle plate 144, top plate 146, or bottom plate 142 and via 165*a* of wire 123*a*, if it is determined there is leakage current between (1) the node of test wire 127*b*, test wire 127*c*', and test wire 127*c*'' and (2) test wire 123*a*.

Method 200 may continue with measuring leakage current across (3) the middle plate MIM test wire and (4) the top/bottom plate MIM test wire(s) (block 214). For example, it is determined whether there is any of leakage current between (3) test wire 127*b* and (4) test wire 127*c*. In another example, is determined whether there is any of leakage current between (3) test wire 127*b* and (4) test wire 127*c*' or test wire 127*c*''.

Method 200 may continue with determining that there is a short between the middle plate 144 and the top plate 146/bottom plate 142 caused by via 165*b*, via 165*c*, via 165*c*', or by via 165*c*'' making contact with a plate that which it is not configured to make contact, or caused by two or more of the plates of the MIM 124 contacting one another, if leakage current is detected across (3) the middle plate MIM test wire and (4) the top/bottom plate MIM test wire(s) (block 216). For example, it is determined there is a short between middle plate 144 and top plate 146 or bottom plate 142 if leakage current is detected between (3) test wire 127*b* and (4) test wire 127*c*. In another example, it is determined there is a short between middle plate 144 and top plate 146 or bottom plate 142 if it is determined there is leakage current between (3) test wire 127*b* and (4) test wire 127*c*' or test wire 127*c*''.

Method 200 may continue with determining whether the measurement time period of detecting the presence of leakage current is complete (block 218) and if so, method 200 may end at block 220 and if not, method 200 continues at block 210.

In some embodiments, there may be a plurality of test structures 100 within the wafer 5 or chip 10. Each individual test structure 100 may be of similar structural geometry and method 200 may be performed upon multiple test structure 100 iterations. In other embodiments, each individual test structure 100 iteration may have differing structural geometries (e.g., the diameter of the vias 165 within the via matrix may be larger or smaller across different structure 100 iterations, the spacing between vias 165 within the via matrix may be greater or smaller across different structure 100 iterations, the distance between via 165*a* and plates 142, 144, or 146 may differ across different structure 100 iterations, the diameter of clearance 150 may be greater or smaller across different structure 100 iterations, or the like) and method 200 may be performed upon multiple test structure 100 iterations. As such, a configuration of a particular MIM capacitor 124 within a particular test structure 100 may be identified where shorts within the three plate MIM capacitor are to be expected (e.g. greater than 0.1% of occurrences), unlikely (e.g. less than 0.1% of occurrences), extremely unlikely (e.g., less than 0.0001% of occurrences), or the like.

Figure 9:
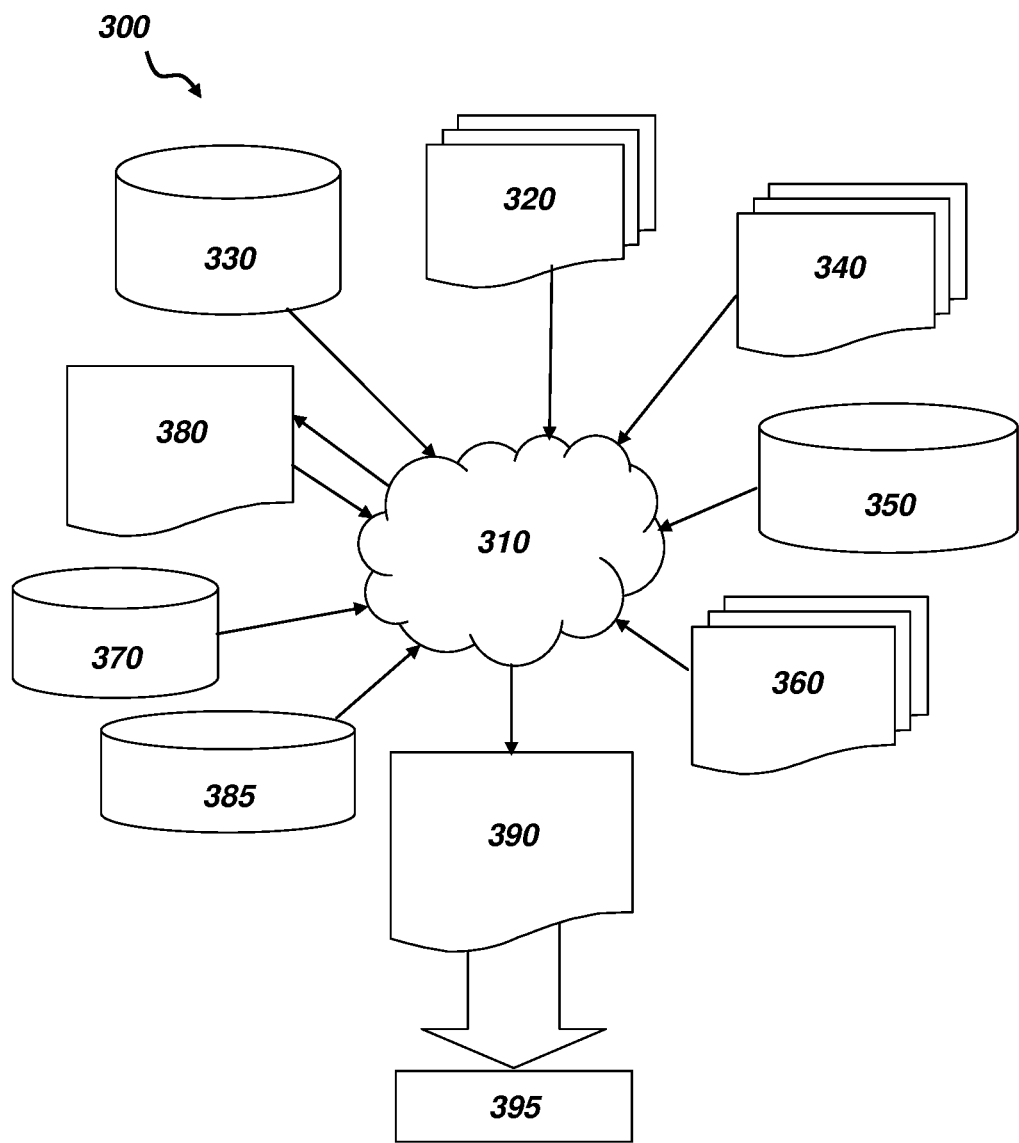
FIG. 9 depicts a block diagram of an exemplary design flow used in semiconductor integrated circuit (IC) logic design, simulation, test, layout, and/or manufacture, in accordance with various embodiments of the present invention.

Referring now to FIG. 9, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIG. 1-FIG. 6B.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIG. 1-FIG. 6B. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIG. 1-FIG. 6B to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1-FIG. 6B. In one embodiment, design structure 390 may comprise a compiled, executable HDL simulation model that functionally simulates the devices shown in FIG. 1-FIG. 6B.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1-FIG. 6B. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication or verification of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The invention claimed is:

1. A method of testing a three plate MIM capacitor structure comprising:
    applying a voltage to a first plate of a three plate MIM capacitor, a second plate of the three plate MIM capacitor, and a third plate of the three plate MIM capacitor;
    applying ground potential to a via adjacent to the three plate MIM capacitor;
    detecting leakage current across the middle plate and the via, detecting leakage current across the top plate and the via, or detecting leakage current across the middle plate and the via; and
    determining there is a short between one of the bottom plate, middle plate, or top plate and the via caused by a defect of the via, if leakage current is detected across the middle plate and the via, if leakage current is detected across the top plate and the via, or if leakage current is detected across the middle plate and the via.

2. The method of claim 1, wherein a first via is connected to the middle plate and extends through an associated clearance of the top plate.

3. The method of claim 2, wherein a second via is connected to both the top plate and the bottom plate and extends through an associated clearance of the middle plate.

4. The method of claim 3, wherein a first wire is connected to the via and is serpentine shaped traversing the three plate MIM capacitor.

5. The method of claim 4, wherein a second wire is connected to the second via, wherein a third wire is connected to the third via, and wherein the second wire and the third wire comprises two parallel portions connected by an orthogonal portion.

6. The method of claim 5, wherein one of the two parallel portions of the third wire is between the two parallel portions of the second wire.

7. The method of claim 4, wherein the first wire is located in a wiring level above or below the three plate MIM capacitor.

8. A three plate MIM capacitor structure comprising:
    a three plate MIM capacitor comprising a bottom plate, a middle plate, and a top plate;
    a via matrix normal to the bottom plate, the middle plate, and the top plate, the via matrix comprising: a first via group comprising vias that are adjacent to the bottom plate, middle plate, and top plate; a second via group comprising vias that are configured to contact only the middle plate; and a third via group comprising vias that are configured to contact only the top plate and bottom plate;
    a first wire within a wiring level below the three plate MIM capacitor connected to the first via group;
    a second wire within a wiring level above the three plate MIM capacitor connected to the second via group; and
    a third wire within a wiring level above the three plate MIM capacitor connected to the third via group.

9. The three plate MIM capacitor structure of claim 8, wherein the vias of the first via group are comprised within a first column of the via matrix, the vias of the second via group are comprised within a second column of the via matrix, and the vias of the third via group are comprised within a third column of the via matrix.

10. The three plate MIM capacitor structure of claim 8, wherein the vias of the first via group are comprised within a first row of the via matrix, the vias of the second via group are comprised within a second row of the via matrix, and the vias of the third via group are comprised within a third row of the via matrix.

11. The three plate MIM capacitor structure of claim 8, wherein the vias of the first via group are comprised within a first diagonal of the via matrix, the vias of the second via group are comprised within a second diagonal of the via matrix, and the vias of the third via group are comprised within a third diagonal of the via matrix.

12. The three plate MIM capacitor structure of claim 8, wherein the vias of the second via group extend through associated clearances within the top plate.

13. The three plate MIM capacitor structure of claim 8, wherein the vias of the third via group extend through associated clearances within the middle plate.

14. The three plate MIM capacitor structure of claim 8, wherein the first wire is serpentine shaped.

15. The three plate MIM capacitor structure of claim 8, wherein each of the second wire and third wire comprises two parallel portions connected by an orthogonal portion.

16. The three plate MIM capacitor structure of claim 15, wherein one of the two parallel portions of the third wire is between the two parallel portions of the second wire.

17. A three plate MIM capacitor structure comprising:
    a three plate MIM capacitor comprising a bottom plate, a middle plate, and a top plate;
    a via matrix normal to the bottom plate, the middle plate, and the top plate, the via matrix comprising: a first via group comprising vias that are adjacent to the bottom plate, middle plate, and top plate; a second via group comprising vias that are configured to contact only the middle plate; and a third via group comprising vias that are configured to contact only the top plate and bottom plate;
    a first wire within a wiring level above the three plate MIM capacitor connected to the first via group;
    a second wire within a wiring level below the three plate MIM capacitor connected to the second via group; and a third wire within a wiring level below the three plate MIM capacitor connected to the third via group.

18. The three plate MIM capacitor structure of claim 17, wherein the vias of the first via group are comprised within a first column of the via matrix, the vias of the second via group are comprised within a second column of the via matrix, and the vias of the third via group are comprised within a third column of the via matrix.

19. The three plate MIM capacitor structure of claim 17, wherein the vias of the first via group are comprised within a first row of the via matrix, the vias of the second via group are comprised within a second row of the via matrix, and the vias of the third via group are comprised within a third row of the via matrix.

20. The three plate MIM capacitor structure of claim 17, wherein the vias of the first via group are comprised within a first diagonal of the via matrix, the vias of the second via group are comprised within a second diagonal of the via matrix, and the vias of the third via group are comprised within a third diagonal of the via matrix.

* * * * *